United States Patent [19]

Reichert et al.

[11] 4,405,826
[45] Sep. 20, 1983

[54] ENCLOSURE SEALING WELL CONSTRUCTION

[75] Inventors: Gilbert A. Reichert, Greendale; Richard A. Pankowski, Franklin, both of Wis.

[73] Assignee: Allen-Bradley Company, Milwaukee, Wis.

[21] Appl. No.: 305,003

[22] Filed: Sep. 24, 1981

[51] Int. Cl.³ .............................................. H05K 5/06
[52] U.S. Cl. .................................. 174/59; 174/52 S; 200/302
[58] Field of Search ................ 174/52 R, 52 S, 50, 174/59, 60; 200/302

[56] References Cited

U.S. PATENT DOCUMENTS

| 2,240,922 | 5/1941 | Bissell ............................... 174/52 S |
| 2,321,508 | 6/1943 | Olley et al. ......................... 200/302 |
| 2,345,757 | 4/1944 | Lester ................................. 200/302 |
| 3,288,910 | 11/1966 | Zerwes ................................ 174/53 |
| 3,385,945 | 5/1968 | Tums ................................. 200/302 |
| 3,392,228 | 7/1968 | Zerwes ................................ 174/52 |
| 3,927,249 | 12/1975 | Pearse ................................ 174/51 |
| 4,246,437 | 1/1981 | Frey et al. ....................... 174/52 PE |

OTHER PUBLICATIONS

Publication 800H-1.0—Apr. 1980, entitled, "Bulletin 800H NEMA Type 7&9 Hazardous Location Push Button Controls".

Primary Examiner—A. T. Grimley
Assistant Examiner—D. A. Tone
Attorney, Agent, or Firm—Arnold J. Ericsen

[57] ABSTRACT

An electrical equipment enclosure sealing well construction includes a cup-like sealing well including at at least one end thereof an integrally formed, hollow socket with its bore communicating with the interior of the sealing well and with an insulating molded terminal block mounted externally of the sealing well. The terminal block contains a channel for receiving a conductive lead which has been previously attached to a terminal having a threaded aperture. The channel is apertured at its lower end to receive the stem of a terminal screw and clamp assembly threadingly engageable with the threaded aperture of the terminal. An insulating hinged cover may be formed as an integral part of the molded terminal block.

10 Claims, 8 Drawing Figures

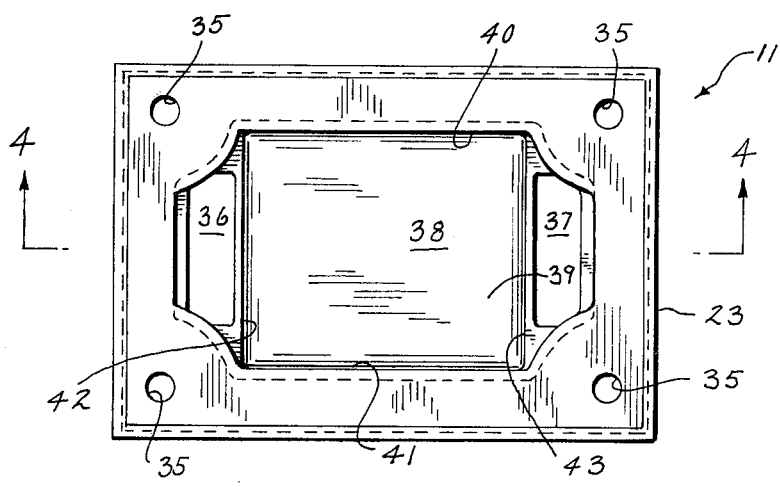
Fig.3
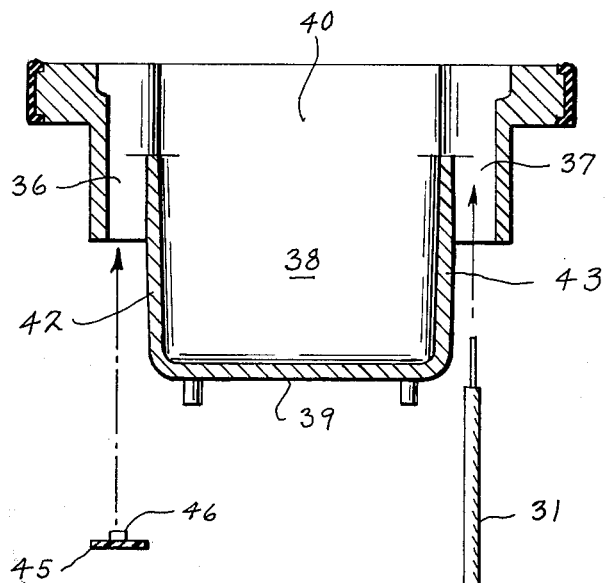
Fig.4
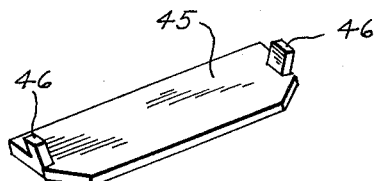
Fig.5
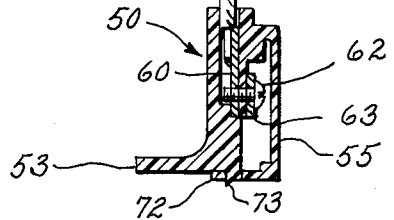

ENCLOSURE SEALING WELL CONSTRUCTION

BACKGROUND OF THE INVENTION

The field of the invention is enclosures for electrical equipment, and particularly, enclosures which include a sealing well for sealing electrical equipment from the surrounding environment.

There are numerous applications where electrical devices such as pushbuttons, pilot lights and similar devices must be sealed off from the surrounding environment. Such seals may, for example, exclude liquids such as water where equipment is exposed to the weather or must be washed down such as in food processing plants, or where an enclosure may inhibit the passage of gases when the equipment is exposed to volatile vapors. Standards have been established for enclosure seals of various types and it is, of course, an objective in the art to meet these standards.

An example of such device may be found in the disclosure of U.S. Pat. No. 4,158,757 granted to Reichert et al. and assigned to the same assignee as the present invention. That particular patent is directed to a seal for an enclosure which includes a metal frame clamped between sealing surfaces on the base member and on an enclosure cover. This may be in the form of a separate frame or may include a frame integrally formed as part of a sealing well.

The present invention is directed to a sealing well which may or may not include the particular sealing concept disclosed in the aforementioned U.S. Pat. No. 4,158,757. In that particular patent, the construction provides a dual function in including an elastomeric ring in combination with a metal frame to provide "metal-to-metal" seal as required in certain standards, and which further satisfies the requirements of other standards for enclosing electrical equipment.

A sealing well, used in combination with a base of an enclosure, reduces installation costs associated with conventional conduit sealing fittings and provides a facile means of installing equipment and connecting the same with powerline conduit and wiring. A typical example of a sealing fitting, which may be eliminated by using a sealing well, may be found in U.S. Pat. No. 4,216,349 granted to Wium. Though these sealing fittings satisfy the electrical standards for effecting the necessary seal of the interior of the conduit, they are not without problems. In the first place, the fitting occupies considerable space and may still require more space for installation, neither of which may be available in cramped quarters. Further, the fittings are sometimes more expensive than the enclosure itself, and thus adds substantially to the cost of the installation.

It is quite often the practice to provide pre-wired sealing wells, and whether pre-wired or field wired, such sealing wells are not without their own problems. That is, the cavities of prior sealing wells were necessarily made relatively shallow to accommodate wiring connectors, such as so-called "wire nuts" disposed between the base of the enclosure and the bottom of a cup-like sealing well seated within the enclosure cavity. This shallow construction obviously limited the length of electrical devices residing within the cavity of the sealing well.

SUMMARY OF THE INVENTION

The present invention relates to an improved sealing well construction for use in an enclosure for electrical equipment. The sealing well is comprised of a cup-like construction having a continuous, laterally extending, integrally-formed flange, and which construction permits the well to be inserted in the cavity of a conventional hollow, cup-like base member and supported by a similar laterally extending flange formed in the base member. The base member is also provided with openings formed to receive conventional conduit fittings. A flanged cover member is provided to complete the seal of the enclosure and is apertured in the top thereof to receive the supporting members of electrical control equipment, such as conventional electrical pushbuttons or the like. Portions of the equipment protrude inwardly of the cover member and are received in the cavity defined by the sealing well. The equipment terminals are connected to a terminal block supported by the sealing well and arranged for electrical and mechanical connection externally of the sealing well. The terminal block is positioned in a relatively confined spaced defined by a portion of an external end wall surface of the sealing well and a facing inner surface of one end of the hollow base member.

It is a general object of the invention to provide an improved sealing well construction defining a cavity for housing electrical equipment wherein a flanged, cup-like sealing well is formed at at least one end thereof with an external, integrally formed socket portion open at both ends with one end communicating internally with the cavity and externally with one end of a terminal block supported externally of the said one end of the sealing well.

The terminal block is preferably injection molded of an insulating material to provide a supporting base and an integrally formed, hinged cover portion having releasable latching means and normally insulating the terminal members and connecting leads from contact with the metallic base member or other neighboring electrically conductive elements. The terminal members are further isolated from one another and other conductive elements by being disposed in separate, parallel compartments integrally formed in the terminal block.

BRIEF DESCRIPTION OF THE DRAWINGS

FIG. 3 is a top plan view of the sealing well construction embodying the present invention;

FIG. 4 is a sectional view taken on lines 4—4 of FIG. 3;

FIG. 5 is a perspective view of an insert closure member for sealing an unoccupied socket portion of the sealing well construction;

DESCRIPTION OF THE PREFERRED EMBODIMENT

Figure 1:
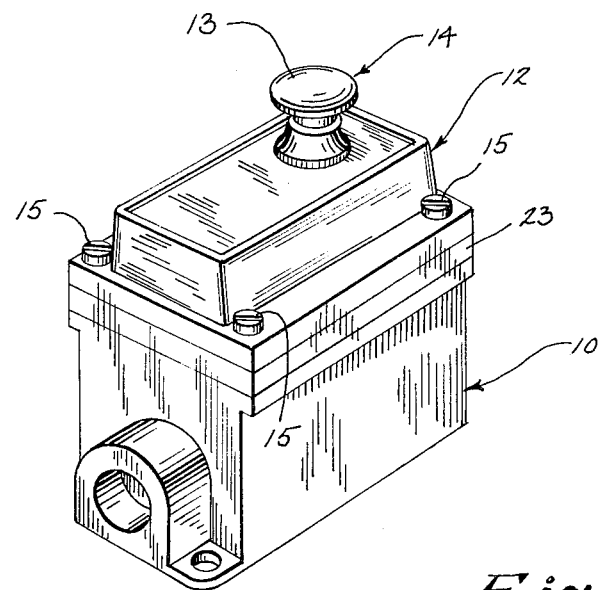
FIG. 1 is a perspective view of the enclosure which employs the sealing well construction of the present invention.
Figure 2:
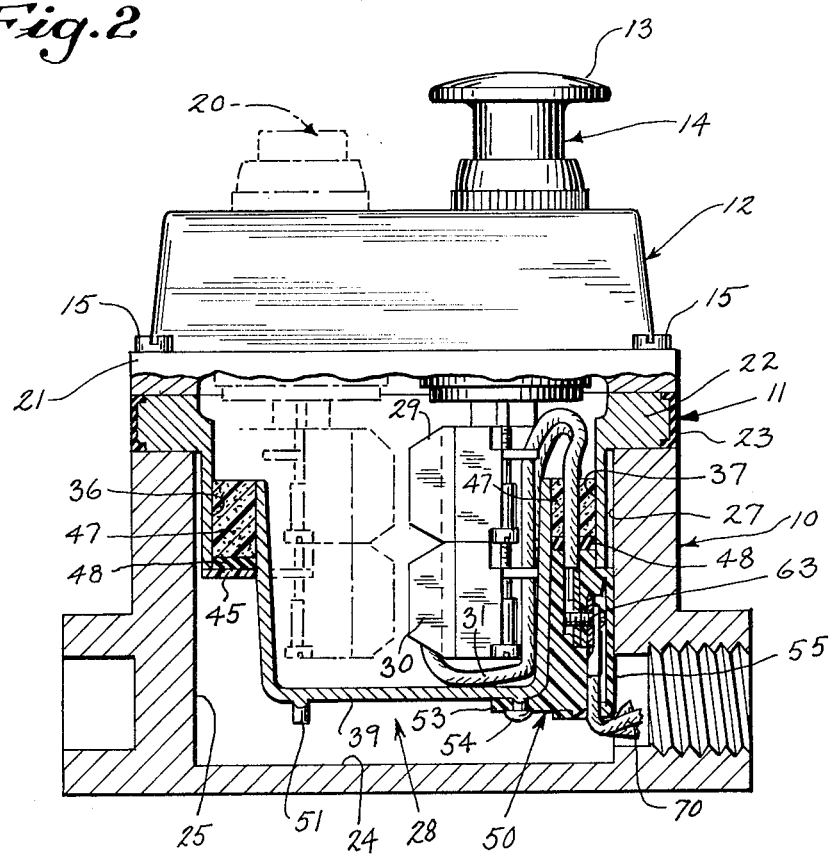
FIG. 2 is a side elevational view of the enclosure, and partly in section to illustrate the construction of the present invention.

Referring to FIGS. 1 and 2, an enclosure for a pushbutton switch or the like includes a base member 10, a sealing well 11, and a cover, or top 12. Supported by and extending through the cover 12 is the actuator portion 13 of a pushbutton 14. Each of the members 10, 11 and 12 are joined together by means of threaded fasteners 15.

The sealing well construction of the present invention is best described with attention being directed to FIGS. 2-5 inclusive. The electrical equipment, such as the pushbutton 14 supported by the cover 12, has a portion thereof extending inwardly of the cover 12, and the cup like sealing well 11. Although not particularly described, it will be apparent that a second device 20 (shown here in phantom lines) may also be provided and supported by the cover in a manner similar to the pushbutton 14. The cover 12 may be apertured (not specifically shown) to receive devices 14 and 20, respectively. Both the base member 10 and the cover 12 are conventional, and have been illustrated and described in the aforementioned U.S. Pat. No. 4,158,757. The cover 12 is provided with a continuous, laterally extending, integral flange portion 21 arranged to be seated in facing relationship with the flange 22 of the sealing well 11. Flange portion 22 on the sealing well 11 provides the seal described and claimed in the U.S. Pat. No. 4,158,757. Briefly, the metal frame defined by the flange 22 provides a "metal-to-metal" seal with the sealing surfaces on the enclosure base member 10 and the cover 12 and an elastomeric ring 23, including oppositely directed beads (not shown). The beads are compressed by the sealing surfaces to provide an "elastomeric" seal surrounding the outer periphery of the enclosure. The sealing surfaces of the various members of the enclosure are typically machined flat so that they tightly mate with one another when the top or cover 12 is fastened directly to the sealing well 22 and, in turn, the sealing well mates with the base member 10 to provide the metal-to-metal seal. It is preferable to mold the elastomeric ring 23 directly to the outer edge of the flange portion 22.

Figure 8:
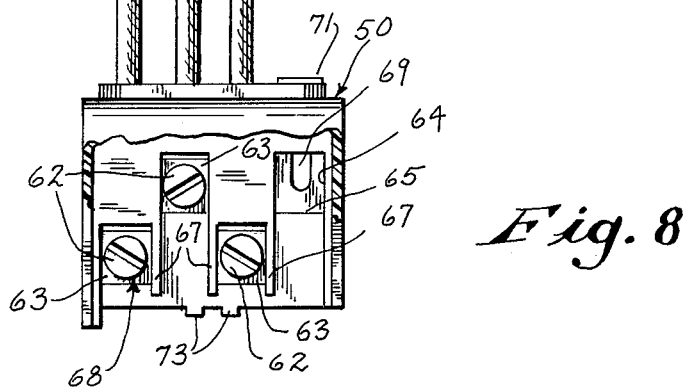
FIG. 8 is a side elevational view of the terminal block of FIGS. 6 and 7 with portions of a hinged cover removed to illustrate the terminal members thereof.

With particular reference to the view of FIG. 2, the base 10 for the pushbutton enclosure is cast from aluminum and includes a bottom 24 and four upright walls, three of which are shown in FIG. 2 and referred to by the reference characters 25, 26 and 27. The walls and bottom define a cavity generally indicated at 28. The portion of the pushbutton switch 14 supported by and depending from the cover 12 comprises upper and lower contact modules 29 and 30, the construction of which is fully described and claimed in U.S. Pat. No. 3,514,554 granted to Gerd C. Boysen and assigned to the same assignee as the present invention. The modules 29 and 30 are each connected in the usual fashion (not shown) to conductive leads 31, three of which are shown in FIGS. 2, 4 and 8, and which will be further described in connection with the detailed description of the terminal block construction of the present invention.

Attention is now directed to FIGS. 3-5, inclusive, wherein the details of the sealing well assembly are more clearly illustrated for purposes of description. The sealing well 11, as previously described, contains the integrally formed, laterally extending flange 22 which is apertured at 35 to receive the threaded fasteners 15. Flange 22 also includes the aforementioned elastomeric ring 23. As seen in FIG. 4, the sealing well 11 may be of cast aluminum and is formed to provide hollow sockets 36 and 37, communicating at their respective upper ends with a cavity 38 defined by the bottom 39, sidewalls 40 and 41 and endwalls 42 and 43. Sockets 36 and 37 are also formed to be opened at each of the respective lower ends to communicate with the cavity 28 of the base member 10.

It is preferred to provide both hollow sockets 36 and 37 in the same molding, even though only one is used, as in the present case. Where only one pushbutton 14 is required, it becomes necessary to plug one of the sockets, such as the socket 36. This is conveniently done with the use of the separate closure 45 which may be made of a nylon molding and include resilient ears 46. The ears 46 retain closure 45 by means of frictional engagement with the side walls of the socket 36. Thus, the closure 45 will provide a molding form for supporting sealants 47 and 48 as they are cast in the liquid state and later cured in the usual manner (see FIG. 2). The sealant 47 is preferably cured at room temperature and is normally so non-viscous in the uncured state that it requires a thin layer of a silicone rubber sealant 48 to retain the epoxy in the socket 36 until cured. Thus, the sealing well will be effectively sealed from the environment when the socket 36 is unoccupied.

With attention now being drawn to end wall 43 and its integrally formed socket 37, it will be noted that the hollow bore of this socket is arranged to communicate directly with a terminal block of insulating material and indicated generally by the reference 50. The conductive leads 31 are received by the socket 37. It is preferred to integrally form protruding studs 51 in the bottom 39 of the sealing well 11 received by apertures 52 (see FIG. 6) of the supporting base 53 of the terminal block 50. As shown best in FIG. 2, the studs 51 are headed by riveting to secure the base 53 to the bottom 39 of the sealing well 11. The terminal block 50 further includes an integrally formed support wall 54 and hinged cover 55. The cover 55 is formed with and joined to the wall 54 by means of a hinge 56 of relatively thin wall thickness when compared with the thickness of the wall 54 and cover 55.

The terminal block 50 will next be described in connection with the views of FIGS. 4-8, inclusive. As stated previously, the conductive leads 31 are arranged for connection with the upper and lower contact modules 29 and 30 of the pushbutton 14. The opposite ends of these leads 31 are preferably spot welded to terminals 60 which are of general rectangular configuration and are each provided with a threaded aperture 61. The threaded apertures 61 are arranged to receive the respective terminal screws 62 seated in the terminal clamping pads 63 of the wire clamp assembly 68 (see FIG. 6). The wire clamp assembly 68 is fully disclosed and claimed in U.S. Pat. No. 3,177,456 granted to John Haydu et al and assigned to the same assignee as the present invention.

Figure 6:
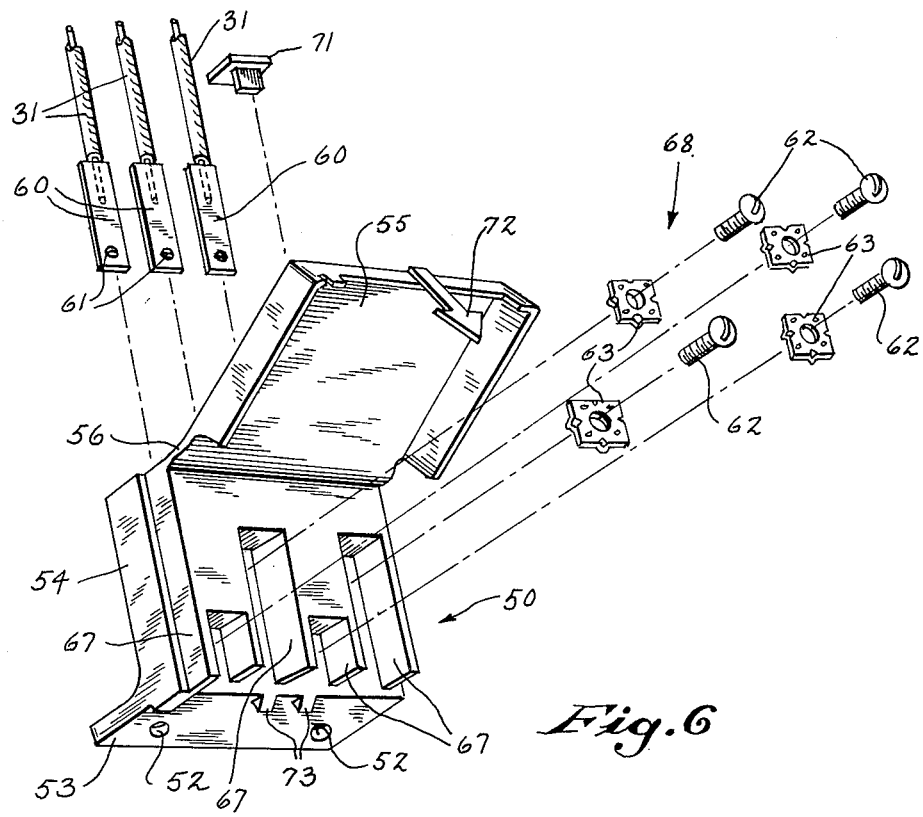
FIG. 6 is an exploded perspective view of the terminal block component of the sealing well construction.
Figure 7:
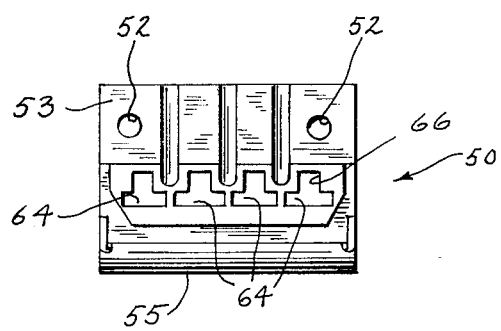
FIG. 7 is a top plan view of the terminal block of FIG. 6.

The rectangular terminals 60 are arranged to be seated in sliding engagement within the T-shaped channels 64, the configuration of which is illustrated in FIG. 7. The terminals 60, when seated in the respective channels 64 "bottom" at the shoulder 65 of each of the channels 64. This is more clearly shown in FIG. 8 in the unoccupied channel of the position farthest to the right with respect to the drawing. It is further to be observed that the forward surface of the support wall 54 includes elongated apertures 69 in register with the terminal apertures 61 for receiving the threaded shank of the respective terminal screw 62. It is to be noted that the "stem" 66 of the T cross section of the channels 64 is provided to receive the conductive lead portion 31 attached to that side of the terminal 60. It will also be noted that barriers 67 (see FIGS. 6 and 8) are integrally formed in the support wall 54 to provide an electrical clearance between the respective adjacent terminal screws 62 and clamping pad 63. As shown in FIG. 2, the conductive leads 70 are each connected to the respective conductive leads 31 via the terminals 60 and the wire clamp assembly 68. It will also be noted from FIG. 2 that each of the channels 64 are also sealed with the silicone rubber sealant 48 and the epoxy composition 47.

The terminal block 50 is provided with a fixed number of channels 64, and when one channel is unoccupied, as in the present illustration, it may be plugged by means of a plug 71 inserted therein. This will complete the sealing of the device, as heretofor mentioned, the epoxy and silicone sealant will be disposed above the plug and above the terminal block in the socket 47 as described earlier. The plug 71 will prevent the sealing materials from flowing into the terminal block.

As stated previously, the cover 55 is attached to the support wall 54 and is joined to the wall by means of an integral hinge 56 of relatively thin thickness. The cover 55 is also molded with a bias towards the open position as seen in FIG. 6. The cover 55 is held in a closed position to protect the wire clamp assemblies 68 by means of a detent 72 engageable with protruberances 73 which define an indent element to complete a latching means. The arrow-like distal end portion of the detent 72 permits an operator to manually release the detent by lifting the arrow portion with his fingernail.

It will be apparent that the present sealing well construction provides a convenient enclosure which may include a protective terminal block supported at either of two end walls or both of the end walls, as desired. Conventional sealing wells require comparatively greater space between the bottom wall 39 of the sealing well 11 and the bottom wall 24 of the base member 10 to permit connection with wire nuts and other fasteners. The depth of the cavity 38 of the sealing well is increased when compared to conventional sealing wells, to provide greater wiring room and permit the support of electrical devices of comparatively extended length.

The embodiments of the invention of which an exclusive property or privilege is claimed are defined as follows:

1. In an enclosure including a cup-like base member defining a cavity for receiving an electrical device and having an end wall apertured to receive a first conductive lead, a cup-like sealing well seated within the base member cavity and an enclosure cover including means for supporting said electrical device, a portion of said electrical device being received within the cavity of the sealing well: the combination therewith of a terminal block supported externally of a wall surface of said sealing well and in the space between facing wall surfaces of the sealing well and base member, said terminal block including means for receiving a second conductive lead having one end disposed in the sealing well cavity for electrical connection to the electrical device; detachable connecting means for joining the said first and second conductive leads.

2. The enclosure of claim 1, wherein the sealing well includes a hollow socket formed integrally with a wall of said sealing well and having a bore communicating at one end with the sealing well cavity and at its opposite end with said terminal block, the said second conductive lead being received in said hollow socket.

3. The enclosure of claim 2 including a sealant compound disposed in said socket.

4. The enclosure of claim 2 including a second integrally formed hollow socket and means for enclosing said socket when unoccupied, said means including a closure for one end of the socket and frictionally secured therein and a sealant compound disposed in said socket.

5. The enclosure of claim 2, wherein the terminal block is molded to include an elongated channel defining an aperture in the forward wall thereof, a terminal disposed in the channel and connected to the second conductive lead, said terminal defining a threaded aperture in register with the channel aperture, and a wire clamp assembly including a terminal screw threadingly engageable with the terminal aperture and including a clamping pad for electrical connection to said first conductive lead externally of said terminal block channel.

6. The enclosure of claim 1, wherein the terminal block is molded to include an elongated channel defining an aperture in the forward wall thereof, a terminal disposed in the channel and connected to the second conductive lead, said terminal defining a threaded aperture in register with the channel aperture, and a wire clamp assembly including a terminal screw threadingly engageable with the terminal aperture and including a clamping pad for electrical connection to said first conductive lead externally of said terminal block channel.

7. The enclosure of claim 6, wherein the terminal block includes integrally formed barriers positioned at opposite sides of the wire clamp assembly.

8. The enclosure of claim 7, wherein a cover is provided as a closure for said wire clamp assembly.

9. The enclosure of claim 8, wherein the cover is provided with a hinge portion and is integrally molded with the terminal block.

10. In an enclosure for an electrical device, including a cup-like base member defining a cavity for receiving an electrical device and having an end wall apertured to receive a first conductive lead, a cup-like sealing well seated within the base member cavity and an enclosure cover including means for supporting said electrical device, a portion of said electrical device being received within the cavity of the sealing well: the combination therewith of a hollow socket integral with an end wall of the sealing well and having a bore communicating at one end with the sealing well cavity and at its opposite end with a terminal block disposed between the sealing well and base member end walls, said terminal block including a channel for receiving a second conductive lead having one end attached to a terminal disposed in the channel and with the opposite end of the lead disposed in the sealing well cavity for electrical connection to the electrical device; the terminal including a threaded aperture in register with an aperture in the wall of said terminal block channel; a wire clamp assembly for joining the said first and second conductive leads and comprising a clamping member and a threaded screw received by the channel aperture and engageable with the threaded terminal aperture when said terminal is disposed in the channel, barriers extending from the terminal block at opposite sides of said clamping member; and a cover for said terminal block providing a closure for said wire clamp assembly.

\* \* \* \* \*

UNITED STATES PATENT AND TRADEMARK OFFICE
CERTIFICATE OF CORRECTION

PATENT NO. : 4,405,826

DATED : September 20, 1983

INVENTOR(S) : Gilbert A. Reichert et al

It is certified that error appears in the above-identified patent and that said Letters Patent are hereby corrected as shown below:

Column 2, Line 30 - After "ends" insert --and--

Column 6, Lines 12-21 - These lines contain Claim 5 and should be deleted.

Column 6, Line 22 - "6." should be --5.--

Column 6, Line 32 - "7." should be --6.--. Also, "claim 6" should be --claim 5--.

Column 6, Line 35 - "8." should be --7.--. Also, "claim 7" should be --claim 6--.

Column 6, Line 37 - "9." should be --8.--. Also, "claim 8" should be --claim 7--.

Column 6, Line 39 - Claim 9 of the application was omitted. Claim 9 should be inserted and it reads as follows:

--9. The enclosure of claim 2, wherein the terminal block is molded to include an elongated channel defining an aperture in the forward wall thereof, a terminal disposed in the channel and connected to the second conductive lead, said terminal defining a threaded aperture in register with the channel aperture, and a wire clamp assembly including a terminal screw threadingly engageable with the terminal

UNITED STATES PATENT AND TRADEMARK OFFICE
CERTIFICATE OF CORRECTION

PATENT NO. : 4,405,826

DATED : September 20, 1983

INVENTOR(S) : Gilbert A. Reichert et al

It is certified that error appears in the above-identified patent and that said Letters Patent are hereby corrected as shown below:

aperture and including a clamping pad for electrical connection to said first conductive lead externally of said terminal block channel.--

Signed and Sealed this

Nineteenth Day of June 1984

[SEAL]

Attest:

Attesting Officer

GERALD J. MOSSINGHOFF

Commissioner of Patents and Trademarks